(12) United States Patent
Anzaki et al.

(10) Patent No.: US 6,316,110 B1
(45) Date of Patent: Nov. 13, 2001

(54) ELECTROMAGNETIC WAVE FILTER FOR PLASMA DISPLAY PANEL

(75) Inventors: Toshiaki Anzaki; Etsuo Ogino; Terufusa Kunisada, all of Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/265,417

(22) Filed: Mar. 10, 1999

(30) Foreign Application Priority Data

Apr. 16, 1998 (JP) .................................................. 10-106610

(51) Int. Cl.[7] ............................. B32B 15/00; B32B 17/06
(52) U.S. Cl. ..................... 428/432; 359/359; 359/360; 359/580; 359/586; 359/588; 359/589; 428/432; 428/428; 428/696; 428/701; 428/702; 428/212; 428/216; 428/697; 428/699; 428/336; 428/343; 428/344
(58) Field of Search ................................. 359/359, 360, 359/580, 586, 588, 589; 428/432, 428, 696, 701, 702, 212, 216, 697, 699, 336, 343, 344

(56) References Cited

U.S. PATENT DOCUMENTS 4,234,654 * 11/1980 Yatabe et al. ......................... 428/333
5,743,778 * 4/1998 Arimoto et al. ......................... 445/8
6,104,530 * 8/2000 Okamura et al. ..................... 359/359

FOREIGN PATENT DOCUMENTS

10217380 * 8/1998 (JP) .
5-42624  2/1993 (JP) ................................ B32B/7/02

* cited by examiner

Primary Examiner—Deborah Jones
Assistant Examiner—Jennifer McNeil
(74) Attorney, Agent, or Firm—Sughrue, Mion, Zinn, Macpeak & Seas, PLLC

(57) ABSTRACT

An electromagnetic wave filter for a plasma display panel which is effective in preventing incorrect actions of a remote control of appliances, comprising a transparent substrate, a light transmitting electromagnetic wave shield film, and a resin protective film, wherein the electromagnetic wave shield film is a 7-layered laminate in which a dielectric layer and a metal layer containing silver as the principal ingredient are laminated alternately with the dielectric layer being the first to be provided on the transparent substrate, the dielectric layer has a refractive index of 1.6 to 2.8 at 550 nm, and the metal layer containing silver as the principal ingredient contains 0.1 atomic % or more and less than 0.5 atomic % of palladium based on silver and has a thickness of 5 to 25 nm, whereby the electromagnetic wave shield film has a sheet resistance of 3 Ω/□ or lower and a near infrared transmission of 20% or lower at 850 nm.

11 Claims, 1 Drawing Sheet

ELECTROMAGNETIC WAVE FILTER FOR PLASMA DISPLAY PANEL

FIELD OF THE INVENTION

The present invention relates to an electromagnetic wave filter which is suitably used in front of a plasma display panel to cut the electromagnetic wave generated by a plasma discharge. More particularly, it relates to an electromagnetic wave filter having a high visible light transmission and a low near infrared light transmission as well as the inherent shielding performance against electromagnetic waves, and also having sufficient durability for practical use. The electromagnetic wave filter of the present invention can also be used to cut electromagnetic waves emitted from a cathode ray tube (CRT) or a field emission display (FED).

BACKGROUND OF THE INVENTION

Electromagnetic wave filters comprising a transparent substrate, and a dielectric layer and a metallic layer which are laminated thereon alternately in this order from the substrate side are known as electromagnetic wave filters transparent in the visible region which comprise a transparent substrate, such as a glass plate, having formed on one surface thereof an electromagnetic wave shield film. Such an electromagnetic wave shield film used for this purpose is a film obtained by coating or covering an electrically conductive substance (having a small surface resistance) on a substrate in order to shield electromagnetic waves. For example, a laminate of a thin dielectric film of, e.g., a transparent metal oxide and a thin film of silver is known as a conductor film having a low resistance while securing a high visible light transmission.

JP-A-5-42624 discloses a glass plate coated with an infrared ray shield film having a structure that a silver layer is sandwiched between a pair of dielectric layers. The JP-A discloses that dielectric layers, which protect the silver layer, each use a laminate comprising at least two layers of a zinc oxide layer and a tin oxide layer. The JP-A also discloses that the infrared ray shield film can be used to windows or electronic components as an electromagnetic wave shield film.

JP-A-9-85893 discloses a laminate, formed on a glass substrate, comprising a silver layer containing 0.3 atomic % or more of palladium as a metallic layer and a zinc oxide layer containing a metal such as aluminum as a dielectric layer, wherein addition of aluminum, etc., to the zinc oxide layer reduces the internal stress to improve the adhesion to the silver layer. It also discloses a laminate of five-layered structure (two silver layers are used) having improved resistance to moist heat.

JP-A-8-104547 discloses an infrared ray shield film for an insulating sealed double-glazed unit, which is laminate of a five-layered structure having two silver layers as metallic layers and a tin oxide layer or a zinc oxide layer as dielectric layers, i.e., a structure of dielectric layer/silver layer/dielectric layer/silver layer/dielectric layer. According to the disclosure, the thickness of the dielectric layers are adjusted to make transmitted light and reflected light colorless for use on window glass.

A plasma display panel is known as a large-sized image display, but requires a powerful plasma discharge for achieving a high bright display. The plasma display panel therefore emits near infrared rays together with electromagnetic waves from the discharge region toward the front of the panel. It has been pointed out that electromagnetic waves have a possibility of giving adverse influences to a human body. The infrared rays emitted may be detected by the receptor of a remote control of appliances near the plasma display panel, so that an incorrect action may occur to turn the switch on. Various methods for preventing this have been investigated.

To overcome the above problems, it is proposed to provide a transparent material having a electromagnetic wave shield performance in front of the plasma display panel. In this connection, a method is investigated, which comprises attaching an electromagnetic wave filter comprising a dielectric layer and a silver layer which are alternately laminated, to the front of a plasma display. Such an electromagnetic wave filter is required to have the following performances:

(1) a shielding effect against electromagnetic waves.

(2) a low transmission to heat rays of the near infrared region (region of 800 to 900 nm), which are used for remote control of appliances by a remote control switch, thus having a performance for preventing an incorrect action of the appliances near the plasma display panel.

(3) a high visible light transmission to secure a bright image display.

(4) a sufficient durability against moist heat, etc., since the filter is used in the state exposed in air.

In order to satisfy both the performances (2) and (3) above, it is necessary to design the electromagnetic wave shield film so as to have the characteristics as a so-called optical low path filter, i.e., to have a high transmission at a visible light region and a low transmission at a near infrared light region, namely, showing a rapidly low transmission at the border of the two regions. This has led the concept for overcome the problem in the present invention.

JP-A-5-42624 discloses an infrared ray shield film on a glass plate, wherein a dielectric layer to be a protective layer comprises a laminate of at least two layers of a zinc oxide layer and a tin oxide layer. Therefore, durability such as resistance to moist heat resistance is excellent. However, since only one silver layer is used, the electromagnetic wave shielding performance is not sufficient. Further, even when the film is used in front of a plasma display, the film has a high infrared ray transmission in the near infrared region, making it difficult to prevent an incorrect action of a remote control of appliances near the display.

The laminate covered on the glass plate, disclosed in JP-A-9-85893 supra has improved resistance to moist heat due to that a silver layer containing 0.3 atomic % or more of palladium is used as a metallic layer, and a zinc oxide layer having added thereto a metal such as aluminum is used as a dielectric layer to reduce the internal stress and improve adhesion to the silver layer. However, since two silver layers (in five-layered structure) are used, it is difficult to obtain the requirements (2) and (3) required as the plasma display panel.

Further, regarding the infrared ray shield film disclosed in JP-A-8-104547 supra, it is a five-layered structure containing two silver layers. Therefore, it is difficult to obtain the requirements (2) and (3) for the same reason as above.

SUMMARY OF THE INVENTION

Accordingly, an object of the present invention is to provide an electromagnetic wave filter which has a function of screening out electromagnetic waves and infrared rays radiated from a plasma display panel while retaining a high visible light transmission and sufficient durability for practical use.

As a result of extensive investigation, it has been found that a resistance value required for serving as a front electromagnetic wave filter for a plasma display panel, a low transmission in the near infrared region (in the vicinities of 850 nm), and practical moist heat strength are secured by dividing a metal layer containing silver as the principal ingredient into three layers and adding a prescribed amount of palladium to each divided metal layer containing silver as the principal ingredient.

The present invention provides an electromagnetic wave filter comprising a transparent substrate, a light transmitting electromagnetic wave shield film coated on one surface thereof, and a resin protective film provided on the electromagnetic wave shield film, wherein the electromagnetic wave shield film is a 7-layered laminate in which a dielectric layer and a metal layer containing silver as the principal ingredient are alternately laminated in this order from the transparent substrate side, the dielectric layer has a refractive index of 1.6 to 2.8 at a wavelength of 550 nm, and the metal layer containing silver as the principal ingredient each contains 0.1 atomic % or more and less than 0.5 atomic % of palladium based on silver and has a thickness of 5 to 25 nm, whereby the electromagnetic wave shield film has a sheet resistance of 3 $\Omega/\square$ or lower and a near infrared transmission of 20% or lower at a wavelength of 850 nm.

The electromagnetic wave filter according to the present invention, when used in front of a plasma display panel, prevents an incorrect action of a remote control of appliances near the plasma display panel. Further, the electromagnetic wave filter of the present invention has satisfactory resistance to moist heat for practical use due to the specific amount of palladium in the silver layers. With the dielectric layers having a controlled thickness, the electromagnetic wave filter of the present invention has a visible light transmission of 60% or higher to secure a bright display of the plasma display panel.

DETAILED DESCRIPTION OF THE INVENTION

Figure 1:
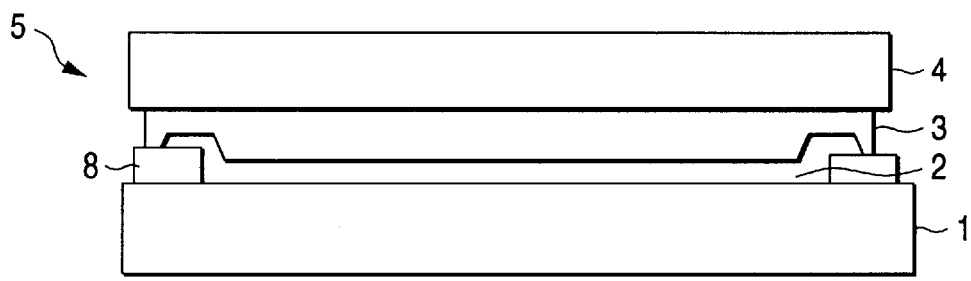
FIG. 1 is a schematic cross section showing an example of the electromagnetic wave filter according to the present invention.

The metal layer containing silver as the principal ingredient (hereinafter simply referred to as a "silver layer") which can be used in the present invention contains 0.1 atomic % or more and less than 0.5 atomic % of palladium based on silver. The lower limit of the palladium content is decided to secure practical moist heat resistance, and the upper limit is decided to secure shielding performance against near infrared rays necessary for preventing an incorrect action of a remote control.

It has been ascertained through practical experimentation that an incorrect action of a remote control can be prevented when 80% or more of the near infrared rays emitted from a high luminance plasma display panel are cut. That is, it has been found that the near infrared light shielding performance decreases linearly as the palladium content in the silver layer increases and that the palladium content should be less than 0.5 atomic % based on silver in order to reduce the infrared light transmission to 20% or lower.

On the other hand, it has also been found that the silver layer should contain at least 0.1 atomic % of palladium in order to secure sufficient moist heat resistance for practical use of the electromagnetic wave shield film.

For enhancement of moist heat resistance, the palladium content is preferably 0.15 atomic % or more, and more preferably 0.2 atomic % or more. Further, for enhancement of near infrared light shielding performance, the palladium content is preferably 0.4 atomic % or less, and more preferably 0.35 atomic % or less.

Each silver layer has a thickness of 5 to 25 nm. Putting weight on an increase of visible light transmission, a preferred thickness of the silver layer is 5 to 10 nm, in which range a visible light transmission much higher than 60% can be obtained. Weight being put on a reduction of the near infrared light transmission (a sheet resistance value lowers), on the other hand, a preferred thickness of the silver layer is more than 10 nm. The terminology "visible light transmission" as used herein denotes a luminous transmittance Y of a Cealab color coordinate system using CIE standard illuminant $D_{65}$.

Although the three silver layers may be substantially equal in thickness, it is preferable that the thickness of the middle layer (the second silver layer as counted from the transparent substrate) be larger than the thickness of the other two layers (the first and third layers as counted from the transparent substrate) for obtaining a high visible light transmission under the state with a narrowed transmissible region. In this case, it is preferred that the thickness of the second silver layer does not exceed 50% of the thickness of the first and third layers. If the thickness of the second silver layer exceeds 50% of the thickness of other silver layers, the transmitted light assumes a green color, which is not preferable. The term "substantially equal in thickness" as used above means that the thickness of a layer is within ±15% of the thickness of another layer.

Of the four dielectric layers, the second and third layers (as counted from the transparent substrate) each preferably have a thickness larger than the first or fourth layers. The reason for this is that such provides a filter which transmits visible light, in which light interference is efficiently utilized.

Further, it is preferred that the first and fourth dielectric layers be substantially equal in thickness, the second and third layers be substantially equal in thickness, and the second and third layers be each 1.3 to 1.9 times as thick as the first or fourth layers. By this thickness design, a filter suitable for use as an electromagnetic wave filter in front of a plasma display can be obtained. The term "substantially equal in thickness" as used herein has the same meaning as described above.

Within the above-specified thickness relationship, it is preferable that the thickness of the second and third dielectric layers be selected from the range 55 to 75 nm, and that of the first and fourth dielectric layers be selected from the range 30 to 60 nm.

The visible light transmission of the electromagnetic wave shield film is preferably 60% or more so as not to impair a bright image display. For this purpose the silver layer is divided into three layers, and the dielectric layers having each silver layer sandwiched therebetween have a refractive index of 1.6 to 2.8 at a wavelength of 550 nm and also a controlled thickness.

The dielectric layers are made of transparent metal oxides, such as zinc oxide, tin oxide, indium oxide, titanium oxide, zirconium oxide, and tantalum pentoxide. These metal oxides can be used either individually or as a mixture thereof. For example, a mixture of zinc oxide and indium oxide or indium-tin oxide (ITO) can be used. The dielectric layer(s) may have either a single layer structure or a multilayer structure composed of two or more metal oxide layers.

Of the above-described transparent metal oxides, zinc oxide, which is electrically conductive, is suitably laminated as a layer directly contacting the silver layer because the pitch of the crystal lattice of zinc oxide is very close to that of silver and is therefore suitable for crystal growth of silver having a small specific resistance (the specific resistance getting smaller as crystallinity increases). Zinc oxide is also preferred because it absorbs a sulfur component, etc., contained in silver corrosive gas in the atmosphere to prevent the sulfur component from reaching the silver layer. Further, a dielectric layer comprising zinc oxide as a main component and a small amount of metals such as aluminum and gallium has an increased electric conductivity, which is advantageous in the step of film formation hereinafter described.

On the other hand, tin oxide or an indium-zinc complex oxide are not only electrically conductive but capable of forming an amorphous film having high gas barrier properties against the above-mentioned corrosive gas thereby to improve the moist heat resistance of the electromagnetic wave shield film. These oxides are also preferred from the standpoint of protection of the silver layer against corrosive gases in the environment (such as the air), such as $H_2S$, $SO_2$, $NO_x$ and HCl.

For these reasons it is preferable that the outermost dielectric layer or each dielectric layer has a double layer structure composed of a tin oxide layer and a zinc oxide layer or an aluminum-containing zinc oxide (hereinafter abbreviated as ZAO) layer. The zinc oxide layer and ZAO layer will be inclusively referred to as a zinc oxide-base layer. The zinc oxide-base layer is preferably provided as a layer directly contacting the silver layer from the standpoint of the above-mentioned crystal lattice relation.

The resin film is provided for chemically and physically protecting the electromagnetic wave shield film from the outer environment, i.e., the atmosphere. The resin film preferably has a refractive index of 1.58 to 1.70 at 550 nm for matching with the light reflected on the interface with the electromagnetic wave shield film. A refractive index of the resin film exceeding 1.70 makes a large difference from that of the electromagnetic wave shield film to increase the interfacial reflected light, resulting in a reduction in transmission of the electromagnetic wave filter. If the refractive index of the resin film is smaller than 1.58, the color of the reflected light seen by a user will be appreciably deviated from a neutral color, which is unfavorable for appearance properties.

A preferred thickness of the resin film is 5 µm to 5 mm. Resins which can be used for the resin film include polyethylene terephthalate (PET), polyester (PE), triacetyl cellulose (TAC), and polyurethane (PW).

The resin film is preferably adhered to the electromagnetic wave shield film via a pressure-sensitive adhesive layer. An acrylic resin pressure-sensitive adhesive is preferred for its satisfactory durability.

The adhesive layer preferably has a thickness of 10 to 500 µm. A thinner adhesive layer than 10 µm is insufficient for leveling its surface when foreign matter enters, which can result in product defects perceptible with the naked eye. A thicker adhesive layer than 500 µm tends to have difficulty in preventing moisture incorporation, resulting in impairment of the durability of the electromagnetic wave shield film. A still preferred thickness of the adhesive layer is about 100 µm.

The transparent substrate which can be used in the present invention includes known glass plates, such as soda-lime glass, borosilicate glass, and alkali-free glass; and plastic plates, such as PET, polymethyl methacrylate (PMMA), and TAC.

The dielectric layers and silver layers are formed by known vacuum film formation techniques. Sputtering is particularly preferred. Of dielectric layers, the ZAO layer is preferably formed by direct current sputtering using a fine powder sintered body of zinc oxide containing several percents of aluminum oxide. In this case, film formation can be carried out in a stable discharge state.

Film formation is usually performed at room temperature. The crystallinity of the silver layer can be improved greatly by occasionally heating the substrate to a temperature of 300° C. or lower during the film formation. Film formation at room temperature can be followed by heat treatment at a temperature up to about 300° C. in the atmosphere or a nitrogen atmosphere to eliminate light absorption of the dielectric layers and to improve the specific resistance of the silver layers.

If desired, an antireflective surface treatment can be applied to the surface of the electromagnetic wave shield film, the outer or inner surface of the resin film, the surface of the transparent substrate having no electromagnetic wave shield film, and the like to thereby increase the visible light transmission to 70% or more.

FIG. 1 is a schematic cross section showing an electromagnetic wave filter 5 according to the present invention. The electromagnetic wave filter 5 has a transparent substrate 1, an electromagnetic wave shield film 2, and a resin film 4 which is adhered to the electromagnetic wave shield film 2 via an adhesive layer 3 to protect the shield film from the air. A bus-bar 8 made of silver paste is provided on the periphery of the transparent substrate 1 for grounding, a part of which is interposed between the transparent substrate 1 and the electromagnetic wave shield film 2.

Figure 2:
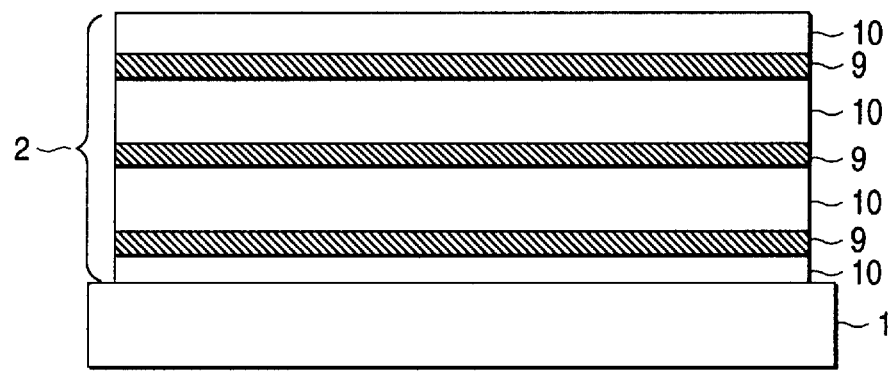
FIG. 2 is a schematic cross section showing the layer structure of an electromagnetic wave shield film of the electromagnetic wave filter according to the present invention.

FIG. 2 is a schematic cross section showing the layer structure of the electromagnetic wave shield film 2 provided on the transparent substrate 1. The electromagnetic wave shield film 2 has a 7-layered structure in which a dielectric layer 10 and a silver layer 9 are laminated alternately each other (three silver layers 9 and four dielectric layers 10). Each of the dielectric layers 10 may be either a single layer made up of one or more of the above-described transparent metal oxides or a multilayer laminate made up of two or more of the transparent metal oxides.

Figure 3:
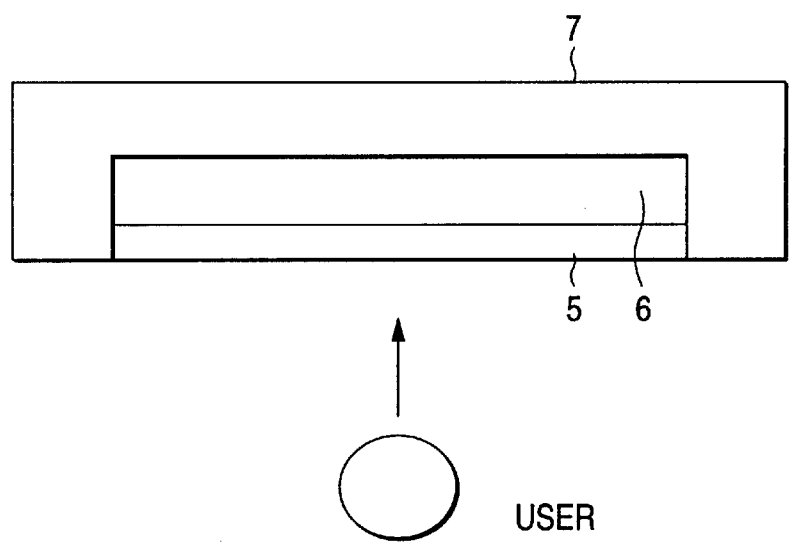
FIG. 3 is a schematic cross section of the electromagnetic wave filter of the present invention in practical use.

FIG. 3 is a schematic cross section of the electromagnetic wave filter 5 in practical use. The circle in FIG. 3 indicates an observer. The electromagnetic wave filter 5 is held by a frame 7 and attached to the front of a plasma display panel 6.

The present invention will now be illustrated in greater detail with reference to Examples and Comparative Examples. The electromagnetic wave filters prepared were evaluated as follows.

1) Moist Heat Resistance

The electromagnetic wave filter was exposed to an atmosphere of 60° C. and 90% RH. The time when development of hillock, pin holes, fogging, etc., was observed with the naked eye was taken as an indication of moist heat resistance. Five hundred hours or longer was judged "good", and less than 500 hours "poor".

2) Sheet Resistance

Measured sheet resistance values lower than 3.0 Ω/☐ were judged "good", and higher values than 3.0 Ω/☐ "poor".

3) Near Infrared Light Transmission

A transmission at a wavelength of 850 nm was measured. Measured values equal to or lower than 20% were judged "good", and higher values than 20% "poor".

4) Transmitted Light Color a*, b*

The values a* and b* of the transmitted light were obtained in each axis in accordance with a Cealab color coordinate system. Samples having both values falling within a range of from −4 to +4 were judged "good", otherwise "poor".

5) Visible Light Transmission

Samples having a visible light transmission of 50% or higher were judged "good", otherwise "poor".

EXAMPLE 1

An $SnO_2$ layer, a ZAO layer, and an AgPd layer were deposited on a 2 mm thick transparent glass substrate having soda-lime-silica composition by means of a large-sized in-line sputtering system to form a 7-layered electromagnetic wave shield film having the structure shown in Table 1. In Table 1, the constituent layers described downward are in the order from the transparent substrate, and the number following AgPd indicates the Pd content in terms of atomic percentage based on Ag. For example, AgPd0.4 is silver containing 0.4 atomic %, based on Ag, of Pd. The $SnO_2$ layer was deposited by using metallic tin as a target and oxygen as an active gas. The ZAO (aluminum-containing zinc oxide) layer was deposited by using a mixture of 94 wt % of zinc and 6 wt % of aluminum as a target and oxygen as an active gas. The AgPd layer was formed by sputtering a mixture of silver and palladium at the indicated atomic ratio in argon gas.

The resulting laminate was heat-treated at 200° C. for 30 minutes in air to eliminate light absorption by the dielectric layers and to improve the crystallinity of the silver layers. An antireflective PET film having an adhesive layer was adhered to the laminate for protecting the electromagnetic wave shield film and preventing the glass from shattering when broken. The performance properties of the resulting electromagnetic wave filter are shown in Table 3 below.

EXAMPLES 2 AND 3

Electromagnetic wave filters were produced in the same manner as in Example 1, except for changing the palladium content in the silver layers and the structure of the dielectric layers as shown in Table 1. The performance properties of the resulting filters are shown in Table 3.

Comparative Examples 1 to 3

Electromagnetic wave filters were produced in the same manner as in Example 1, except for changing the layer structure as shown in Table 2. The performance properties of the resulting filters are shown in Table 3.

TABLE 1

| | | Example 1 | | Example 2 | | Example 3 | |
|---|---|---|---|---|---|---|---|
| Layer Structure | | Material | Thickness | Material | thickness | Material | Thickness |
| Substrate | | glass | 2 mm | glass | 2 mm | glass | 2 nm |
| Electromagnetic Shield Film | 1 | $SnO_2$ | 34 nm | ZAO | 41 nm | $SnO_2$ | 32 nm |
| | | ZAO | 7 nm | | | ZAO | 6 nm |
| | 2 | $AgPd_{0.4}$ | 8 nm | $AgPd_{0.4}$ | 7 nm | $AgPd_{0.3}$ | 12 nm |
| | 3 | ZAO | 7 nm | ZAO | 63 nm | ZAO | 6 nm |
| | | $SnO_2$ | 50 nm | | | $SnO_2$ | 48 nm |
| | | ZAO | 7 nm | | | ZAO | 6 nm |
| | 4 | $AgPd_{0.4}$ | 9 nm | $AgPd_{0.4}$ | 9 nm | $AgPd_{0.3}$ | 14 nm |
| | 5 | ZAO | 7 nm | ZAO | 66 nm | ZAO | 6 nm |
| | | $SnO_2$ | 52 nm | | | $SnO_2$ | 50 nm |
| | | ZAO | 7 nm | | | ZAO | 6 nm |
| | 6 | $AgPd_{0.4}$ | 7 nm | $AgPd_{0.4}$ | 8 nm | $AgPd_{0.3}$ | 12 nm |
| | 7 | ZAO | 7 nm | ZAO | 42 nm | ZAO | 6 nm |
| | | $SnO_2$ | 35 nm | | | $SnO_2$ | 33 nm |
| Adhesive Layer | | | 50 μm | | 100 μm | | 100 μm |
| Resin Film | | PET | 50 μm | PET | 75 μm | PET | 50 μm |

TABLE 2

| | | Comparative Example 1 | | Comparative Example 2 | | Comparative Example 3 | |
|---|---|---|---|---|---|---|---|
| Layer Structure | | Material | Thickness | Material | Thickness | Material | Thickness |
| Substrate | | glass | 2 mm | glass | 2 mm | glass | 2 mm |
| Electromagnetic Shield Film | 1 | $SnO_2$ | 34 nm | $SnO_2$ | 34 nm | $SnO_2$ | 36 nm |
| | | ZAO | 6 nm | ZAO | 7 nm | ZAO | 7 nm |
| | 2 | $AgPd_{1.0}$ | 7 nm | $AgPd_{0.05}$ | 8 nm | $AgPd_{0.4}$ | 11 nm |
| | 3 | ZAO | 7 nm | ZAO | 7 nm | ZAO | 7 nm |
| | | $SnO_2$ | 51 nm | $SnO_2$ | 51 nm | $SnO_2$ | 53 nm |
| | | ZAO | 7 nm | ZAO | 6 nm | ZAO | 6 nm |
| | 4 | $AgPd_{1.0}$ | 9 nm | $AgPd_{0.05}$ | 9 nm | $AgPd_{0.4}$ | 13 nm |
| | 5 | ZAO | 7 nm | ZAO | 7 nm | ZAO | 7 nm |
| | | $SnO_2$ | 50 nm | $SnO_2$ | 53 nm | $SnO_2$ | 36 nm |
| | | ZAO | 6 nm | ZAO | 7 nm | | |
| | 6 | $AgPd_{1.0}$ | 8 nm | $AgPd_{0.05}$ | 8 nm | — | — |
| | 7 | ZAO | 7 nm | ZAO | 7 nm | — | — |
| | | $SnO_2$ | 35 nm | $SnO_2$ | 35 nm | — | — |
| Pressure-Sensitive Adhesive Layer | | | 50 μm | | 50 μm | | 75 μm |
| Resin Film | | PET | 50 μm | PET | 50 μm | TAC | 100 μm |

TABLE 3

| | Example 1 | Example 2 | Example 3 | Comparative Example 1 | Comparative Example 2 | Comparative Example 3 |
|---|---|---|---|---|---|---|
| Sheet Resistance (Ω/☐) | 2.5 (good) | 2.4 (good) | 1.4 (good) | 3.1 (poor) | 2.3 (poor) | 2.7 (poor) |
| Near Infrared | 12 (good) | 11 (good) | 10 (good) | 24 (poor) | 8 (good) | 39 (poor) |

TABLE 3-continued

|  |  | Example 1 | Example 2 | Example 3 | Comparative Example 1 | Comparative Example 2 | Comparative Example 3 |
|---|---|---|---|---|---|---|---|
| Transmission (%) Moist Heat Resistance (hr) | | 672 (good) | 620 (good) | 590 (good) | 696 (good) | 360 (poor) | 64B (good) |
| Transmitted Light Color | a* | −2.0 | −2.2 | −3.8 | −1.8 | −2.7 | −1.5 |
| | b* | 0.1 | 0.0 | 0.2 | 1.9 | 2.6 | 1.4 |
| | Evaluation | Good | Good | Good | Good | Good | Good |
| Visible Light Transmission (%) | 450 nm | 66 | 66 | 58 | 57 | 71 | 72 |
| | 550 nn | 68 | 68 | 53 | 5B | 74 | 74 |
| | 650 nm | 61 | 59 | 47 | 56 | 63 | 69 |
| | Evaluation | Good | Good | Good | Good | Good | Good |

It is seen from Table 3 that the electromagnetic wave filters obtained in Examples 1 to 3 satisfy the requirements of sheet resistance and durability (in terms of resistance to high humidity and high temperature) for practical use and also have high visible light transmissions sufficient for securing a bright display of a plasma display, whereas none of the comparative samples satisfies all the requirements.

EXAMPLE 4

The influence of a palladium content in the silver layers on the transmission at a wavelength of 850 nm was examined as follows. Electromagnetic wave filters were prepared in the same manner as in Example 1, except for varying the palladium content of the three silver layers as shown in Table 4 below (the three silver layers had the same palladium content) by changing the palladium content in the target of sputtering accordingly. Since the specific resistance and visible light transmission of the silver layers varied subtly depending on the palladium content, the thickness of the silver layers was adjusted finely such that the 7-layered electromagnetic shield film might have a sheet resistance of 3.0 Ω/□ or less and a visible light transmission of 65% or more. The results obtained are shown in Table 4.

TABLE 4

| Pd Content in Silver Layer (atomic %) | Transmission at 850 nm (%) |
|---|---|
| 0 | 5.0 |
| 0.20 | 13.0 |
| 0.30 | 16.0 |
| 0.40 | 18.5 |
| 0.45 | 20.0 |
| 0.50 | 20.5 |
| 1.00 | 26.0 |
| 2.00 | 30.0 |

As can be seen from Table 4, the silver layers each having a palladium content equal to or greater than 0.50 atomic % fail to reduce the transmission at 850 nm to 20% or less. In other words, a reduced palladium content in the silver layer makes it possible to reduce the transmission at 850 nm to 20% or less while controlling the sheet resistance and maintaining high visible light transmission.

While the invention has been described in detail and with reference to specific examples thereof, it will be apparent to one skilled in the art that various changes and modifications can be made therein without departing from the spirit and scope thereof.

What is claimed is:

1. An electromagnetic wave filter for a plasma display panel comprising a transparent substrate, a light transmitting electromagnetic wave shield film coated on one surface thereof, and a resin protective film provided on the electromagnetic wave shield film, wherein said electromagnetic wave shield film is a 7-layered laminate in which a dielectric layer and a metal layer containing silver as the principal ingredient are laminated alternately, with the dielectric layer being the first to be provided on said transparent substrate, said dielectric layer has a refractive index of 1.6 to 2.8 at a wavelength of 550 nm, and said metal layer containing silver as the principal ingredient contains 0.1 atomic % or more and less than 0.5 atomic % of palladium based on silver and has a thickness of 5 to 25 nm, whereby said electromagnetic wave shield film has a sheet resistance of 3 Ω/□ or lower and a near infrared transmission of 20% or lower at a wavelength of 850 nm.

2. The electromagnetic wave filter as claimed in claim 1, wherein said dielectric layer has a controlled thickness such that said electromagnetic wave filter has a visible light transmission of 60% or higher.

3. The electromagnetic wave filter as claimed in claim 1, wherein said metal layer containing silver as the principal ingredient each has a thickness of 5 to 16 nm.

4. The electromagnetic wave filter as claimed in claim 1, wherein the second metal layer containing silver as the principal ingredient as counted from the transparent substrate has a thickness larger than that of the first and third metal layers containing silver as the principal ingredient as counted from the transparent substrate.

5. The electromagnetic wave filter as claimed in claim 1, wherein the second and third dielectric layers as counted from the transparent substrate each have a thickness larger than that of the first or fourth dielectric layers as counted from the transparent substrate.

6. The electromagnetic wave filter as claimed in claim 5, wherein said first and fourth dielectric layers are substantially equal in thickness, said second and third dielectric layers are substantially equal in thickness, and the thickness of said second and third dielectric layers is 1.3 to 1.9 times the thickness of said first or fourth dielectric layers.

7. The electromagnetic wave filter as claimed in claim 1, wherein said dielectric layer is a metal layer containing zinc oxide as the principal ingredient.

8. The electromagnetic wave filter as claimed in claim 1, wherein at least the outermost dielectric layer of four dielectric layers has a multilayer structure comprising a tin oxide layer and a metal layer containing zinc oxide as the principal ingredient.

9. The electromagnetic wave filter as claimed in claim 8, wherein the four dielectric layers each have a multilayer structure comprising a tin oxide layer and a metal layer containing zinc oxide as the principal ingredient, with said metal layer containing zinc oxide as the principal ingredient being in contact with the metal layer containing silver as the principal ingredient.

10. The electromagnetic wave filter as claimed in claim 1, wherein said resin film has a refractive index of 1.59 to 1.69 at a wavelength of 550 nm.

11. The electromagnetic wave filter as claimed in claim 1, wherein said resin film is adhered to said electromagnetic wave shield film via a pressure-sensitive adhesive layer having a thickness of 10 to 500 $\mu$m.

\* \* \* \* \*